United States Patent
Akiba

(10) Patent No.: US 9,224,608 B2
(45) Date of Patent: Dec. 29, 2015

(54) SEMICONDUCTOR DEVICE AND METHOD FOR MANUFACTURING THE SAME

(71) Applicant: SEIKO EPSON CORPORATION, Tokyo (JP)

(72) Inventor: Takahisa Akiba, Tsuruoka (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/324,876

(22) Filed: Jul. 7, 2014

(65) Prior Publication Data
US 2015/0014787 A1  Jan. 15, 2015

(30) Foreign Application Priority Data
Jul. 11, 2013 (JP) .................................. 2013-145222

(51) Int. Cl.
*H01L 21/28* (2006.01)
*H01L 21/8234* (2006.01)
*H01L 27/088* (2006.01)
*H01L 29/423* (2006.01)

(52) U.S. Cl.
CPC .. *H01L 21/28008* (2013.01); *H01L 21/823418* (2013.01); *H01L 21/823456* (2013.01); *H01L 21/823462* (2013.01); *H01L 27/088* (2013.01); *H01L 29/42364* (2013.01)

(58) Field of Classification Search
CPC ................................................. H01L 21/28008
See application file for complete search history.

(56) References Cited

U.S. PATENT DOCUMENTS

| | | | |
|---|---|---|---|
| 2006/0163641 | A1 | 7/2006 | Okumura |
| 2010/0052061 | A1 | 3/2010 | Endo et al. |
| 2012/0080759 | A1 | 4/2012 | Ema et al. |

FOREIGN PATENT DOCUMENTS

| | | |
|---|---|---|
| JP | A-2004-128401 | 4/2004 |
| JP | A-2006-135102 | 5/2006 |
| JP | A-2007-048781 | 2/2007 |
| JP | A-2007-073759 | 3/2007 |
| JP | A-2010-056391 | 3/2010 |
| JP | A-2011-119508 | 6/2011 |
| JP | A-2012-079746 | 4/2012 |

*Primary Examiner* — Alexander Ghyka
(74) *Attorney, Agent, or Firm* — Oliff PLC

(57) ABSTRACT

A method for manufacturing a semiconductor device includes: forming a first insulation film on a portion of a first region of a semiconductor substrate and forming a second insulation film between a second region and a third region of the semiconductor substrate; etching an upper portion of the first insulation film such that the thickness of the first insulation film is less than the thickness of the second insulation film; forming a third insulation film in the second region and forming a fourth insulation film in the third region; and forming a first gate electrode on the first insulation film whose upper portion was etched, forming a second gate electrode on the third insulation film, and forming a third gate electrode on the fourth insulation film.

1 Claim, 4 Drawing Sheets

SEMICONDUCTOR DEVICE AND METHOD FOR MANUFACTURING THE SAME

BACKGROUND

1. Technical Field

The present invention relates to a semiconductor device and a method for manufacturing the same.

2. Related Art

Recent years have seen rapid advances in reducing the size and power consumption of semiconductor devices. With increased variation in the kinds of transistors accompanying these advances, high breakdown voltage transistors and low breakdown voltage transistors have come to be formed on the same semiconductor substrate.

FIGS. 8 to 10 in JP-A-2006-135102 show that an oxide film is formed at the same time as the formation of an element-isolating insulation film of a low breakdown voltage transistor, and the oxide film is used as an electric field-relaxing insulation film below the gate electrode of a high breakdown voltage transistor.

Also, in addition to this, FIGS. 2 to 5 in JP-A-2006-135102 show that the element-isolating insulation film of the low breakdown voltage transistor and the electric field-relaxing insulation film below the gate electrode of the high breakdown voltage transistor are formed in separate steps.

However, with the technique shown in FIGS. 8 to 10 in JP-A-2006-135102, the thickness of the element-isolating insulation film of the low breakdown voltage transistor and the thickness of the electric field-relaxing insulation film of the high breakdown voltage transistor are approximately the same. For this reason, there are cases where it is not possible to meet the requirement of reducing the on-resistance by reducing the thickness of the electric field-relaxing insulation film of the high breakdown voltage transistor.

Also, with the technique shown in FIGS. 2 to 5 in JP-A-2006-135102, the exposure alignment for forming the element-isolating insulation film of the low breakdown voltage transistor and the exposure alignment for forming the electric field-relaxing insulation film of the high breakdown voltage transistor need to be performed separately. For this reason, it is necessary to take up more of the alignment margin and there are cases where it is not possible to meet the requirement of reducing the size.

An advantage of some aspects of the invention is to reduce the on-resistance of a high breakdown voltage transistor that has an electric field-relaxing insulation film and to enable a reduction in size.

SUMMARY

In some aspects of the invention, a method for manufacturing a semiconductor device includes: forming a first insulation film on a portion of a first region of a semiconductor substrate and forming a second insulation film between a second region and a third region of the semiconductor substrate; etching an upper portion of the first insulation film such that the thickness of the first insulation film is less than the thickness of the second insulation film; forming a third insulation film in the second region and forming a fourth insulation film in the third region; and forming a first gate electrode on the first insulation film whose upper portion was etched, forming a second gate electrode on the third insulation film, and forming a third gate electrode on the fourth insulation film.

According to this, the upper portion of the first insulation film is etched such that the thickness of the first insulation film is less than the thickness of the second insulation film, and the first gate electrode is formed on the first insulation film whose upper portion was etched. It is thereby possible to reduce the on-resistance of the high breakdown voltage transistor having an electric field-relaxing insulation film and to reduce the size of the semiconductor device.

In the aforementioned aspect, it is desirable to furthermore include: forming a fifth insulation film with a thickness that is less than the thickness of the first insulation film whose upper portion was etched, at a position of being in contact in a plan view with the first insulation film whose upper portion was etched, the position being a portion of the first region. The first gate electrode is formed at a position spanning over the fifth insulation film and a portion of the first insulation film whose upper portion was etched.

According to this, for example, by arranging the first insulation film between the first gate electrode and the drain region, the transistor can be set to the on state in which the electric field is relaxed and a channel is formed directly below the fifth insulation film.

In the aforementioned aspect, it is desirable that the first insulation film and the second insulation film are formed using LOCOS, and the third insulation film, the fourth insulation film, and the fifth insulation film are formed using thermal oxidation.

According to this, it is possible to form insulation films that are respectively appropriate as element-isolating insulation films, electric field-relaxing insulation films, and gate insulation films.

In another aspect of the invention, a semiconductor device includes: a semiconductor substrate; a first transistor that is positioned on the semiconductor substrate and includes a first insulation film and a first gate electrode positioned on the first insulation film; a second transistor that is positioned on the semiconductor substrate; a third transistor that is positioned on the semiconductor substrate; and a second insulation film that is positioned between the second transistor and the third transistor and has a thickness that is greater than the thickness of the first insulation film. The second transistor includes a third insulation film and a second gate electrode positioned on the third insulation film, the third transistor includes a fourth insulation film and a third gate electrode positioned on the fourth insulation film, and the difference in height between the upper end of the first insulation film and the upper end of the second insulation film is greater than the difference in height between the lower end of the first insulation film and the lower end of the second insulation film.

According to this aspect, a configuration is used in which the thickness of the first insulation film is greater than the thickness of the second insulation film and the difference in height between the upper end of the first insulation film and the upper end of the second insulation film is greater than the difference in height between the lower end of the first insulation film and the lower end of the second insulation film. According to this configuration, it is possible to reduce the on-resistance of the high breakdown voltage transistor having an electric field-relaxing insulation film, and to reduce the size of the semiconductor device.

In the aforementioned aspect, it is desirable that the first transistor furthermore includes a fifth insulation film that has a thickness that is less than the thickness of the first insulation film, the first gate electrode is positioned so as to span over a portion of the first insulation film and the fifth insulation film, and the upper end of the first insulation film is located at a lower position than the upper end of the fifth insulation film.

According to this, for example, by arranging the first insulation film between the first gate electrode and the drain region, the transistor can be set to the on state in which the electric field is relaxed and a channel is formed directly below the fifth insulation film.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention are described in detail with reference to the drawings. Note that the embodiments described below are not intended to unduly limit the content of the invention recited in the claims, and all of the configurations described in the embodiments are not necessarily essential as solutions provided by the invention. Also, similar constituent elements are denoted by the same reference sign, and redundant description thereof is omitted.

1. Configuration and Operation

Figure 1:
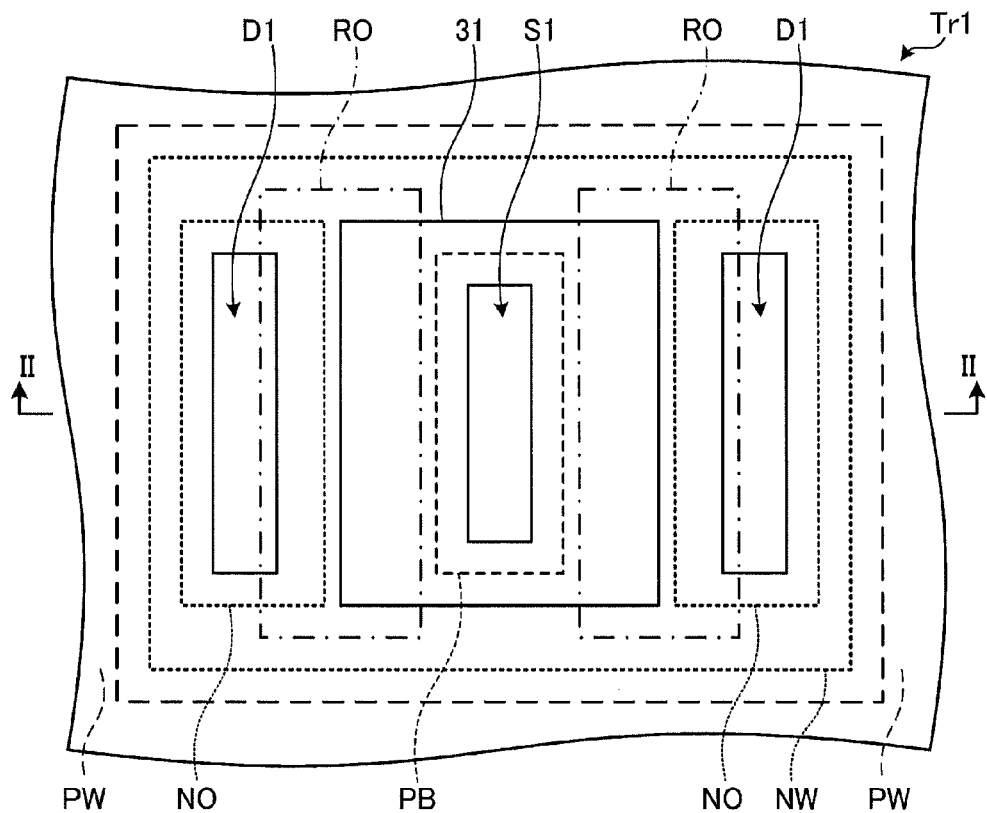
FIG. 1 shows a plan view of a first transistor of a semiconductor device according to an embodiment.
Figure 2:
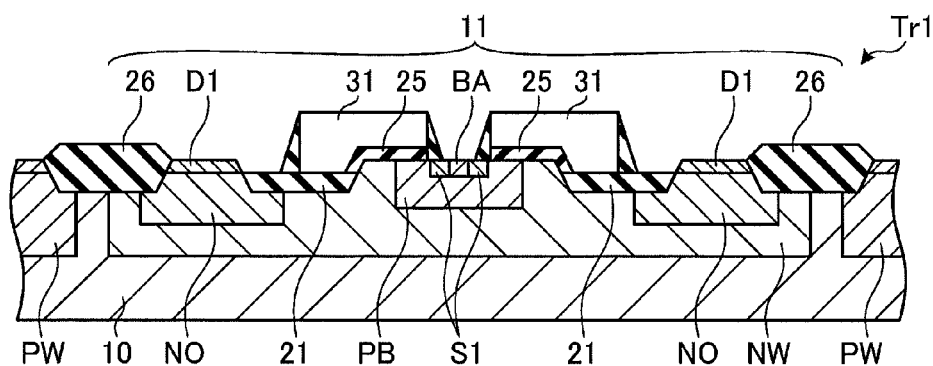
FIG. 2 shows a cross-sectional view taken along line II-II of the first transistor shown in FIG. 1.
Figure 3:
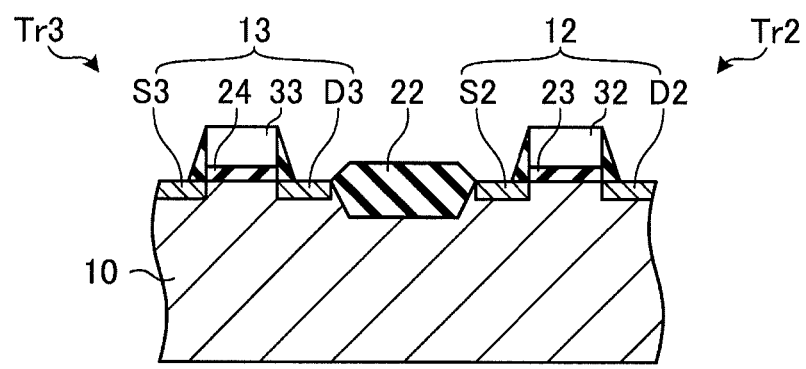
FIG. 3 shows a cross-sectional view of second and third transistors of a semiconductor device according to an embodiment.

FIG. 1 shows a plan view illustrating a first transistor included in a semiconductor device according to an embodiment of the invention. FIG. 2 shows a cross-sectional view taken along line II-II of the first transistor in FIG. 1. FIG. 3 shows a cross-sectional view illustrating second and third transistors included in a semiconductor device according to an embodiment. The semiconductor device according to the present embodiment includes a first transistor Tr1 that is positioned in a first region 11 of a semiconductor substrate 10, a second transistor Tr2 that is positioned in a second region 12 of the semiconductor substrate 10, and a third transistor Tr3 that is positioned in a third region 13 of the semiconductor substrate 10.

1-1. First Transistor Tr1

The first transistor is an example of a high breakdown voltage transistor. In FIGS. 1 and 2, it is shown as a DMOS (Double-diffused Metal Oxide Semiconductor) transistor. As shown in FIGS. 1 and 2, the first transistor Tr1 has a structure that is left-right symmetrical. For this reason, corresponding elements on the left side and the right side are denoted by like reference numerals and redundant description thereof is omitted.

An n-well NW, a p-well PW, a p-body region PB, an n-offset region NO, a source region S1, a drain region D1, and a body contact region BA are positioned in the first region 11 of the semiconductor substrate 10 on which the first transistor T1 is formed.

The n-well NW contains n-type impurities and is positioned in contact with a first face of the semiconductor substrate 10. Here, "first face" refers to the face on the upper side in FIG. 2. The p-well PW contains p-type impurities and is positioned in contact with the first face of the semiconductor substrate 10 surrounding the n-well NW. The p-body region PB contains p-type impurities and is positioned in the n-well NW in contact with the first face of the semiconductor substrate 10. The n-offset region NO contains n-type impurities and is positioned in the n-well NW on the left and right sides of the p-body region PB in contact with the first face of the semiconductor substrate 10.

The source region S1 contains n-type impurities and the body contact region BA contains p-type impurities. The source region S1 and the body contact region BA are positioned in the p-body region PB in contact with the first face of the semiconductor substrate 10. The drain region D1 contains n-type impurities and is positioned in the n-offset region NO in contact with the first face of the semiconductor substrate 10.

A first insulation film 21, a fifth insulation film 25, a sixth insulation film 26, and a first gate electrode 31 are positioned in the first region 11 of the semiconductor substrate 10. A second insulation film 22 to a fourth insulation film 24 will be described later. The first insulation film 21, the fifth insulation film 25, and the sixth insulation film 26 are not shown in FIG. 1.

The sixth insulation film 26 is arranged along the outer periphery of the n-well NW so as to span over the n-well NW and the p-well PW. It is desirable that the sixth insulation film 26 is formed using LOCOS (Local Oxidization of Silicon). Alternatively, it may be formed using STI (Silicon Trench Isolation). The first transistor Tr1 is isolated from the other elements of the semiconductor substrate 10 by the sixth insulation film 26 and the p-well PW.

A first gate electrode 31 is arranged so as to span over the p-body region PB and the n-well NW. The first insulation film 21 and the fifth insulation film 25 are positioned between the first gate electrode 31 and the semiconductor substrate 10. The fifth insulation film 25 is located at a position on the side of the source region S1 in the region between the first gate electrode 31 and the semiconductor substrate 10. The first insulation film 21 is located at a position on the side of the drain region D1 in the region between the first gate electrode 31 and the semiconductor substrate 10, which is a position that is lower than the fifth insulation film 25.

The first insulation film 21 has a function of relaxing the electric field between the first gate electrode 31 and the drain region D1 due to being thicker than the fifth insulation film 25. Note that the first insulation film 21 has a thickness that is less than that of the sixth insulation film 26. In particular, in the present embodiment, the lower end of the first insulation film 21 and the lower end of the sixth insulation film 26 are positioned at approximately the same height and there is a small difference in height therebetween, whereas the position of the upper end of the first insulation film 21 is lower than the position of the upper end of the sixth insulation film 26 and there is a large difference in height therebetween. According to this, it is possible to sufficiently demonstrate the electric field relaxation function of the first insulation film 21 while at the same time the on-resistance of the first transistor Tr1 is reduced.

1-2. Second Transistor Tr2 and Third Transistor Tr3

The second transistor Tr2 and the third transistor Tr3 are examples of low breakdown voltage transistors and are illustrated as MOS transistors in FIG. 3. The second insulation film 22 is positioned between the second transistor Tr2 and the third transistor Tr3 on the semiconductor substrate 10. It is desirable that the second insulation film 22 is formed using LOCOS. Alternatively, it may be formed using STI. The second transistor Tr2 and the third transistor Tr3 are isolated by the second insulation film 22. The thickness of the second insulation film 22 is approximately the same as the thickness of the sixth insulation film 26, and the heights of the lower and upper ends of the second insulation film 22 are approximately the same as the heights of the lower and upper ends of the sixth insulation film 26.

A source region S2 and a drain region D2 are positioned in contact with the first face of the semiconductor substrate 10 in the second region 12 of the semiconductor substrate 10 on which the second transistor Tr2 is formed. The third insulation film 23 is positioned on the region between the source region S2 and the drain region D2, and a second gate electrode 32 is positioned on the third insulation film 23. The thickness of the third insulation film 23 is approximately the same as the thickness of the fifth insulation film 25.

A source region S3 and a drain region D3 are positioned in contact with the first face of the semiconductor substrate 10 in a third region 13 of the semiconductor substrate 10 on which the third transistor Tr3 is formed. The fourth insulation film 24 is positioned on the region between the source region S3 and the drain region D3, and a third gate electrode 33 is positioned on the fourth insulation film 24. The thickness of the fourth insulation film 24 is approximately the same as the thickness of the fifth insulation film 25.

2. Manufacturing Method

FIGS. 4A to 4C and 5D to 5F show cross-sectional views showing steps for manufacturing the first to third transistors shown in FIGS. 2 and 3. FIGS. 4A to 4C and 5D to 5F show the first region 11, the second region 12, and the third region 13 of the semiconductor substrate 10 aligned side-by-side. Only the portion of the first region 11 that corresponds to the right half of the first transistor Tr1 having a left-right symmetrical structure is shown.

Figure 4:
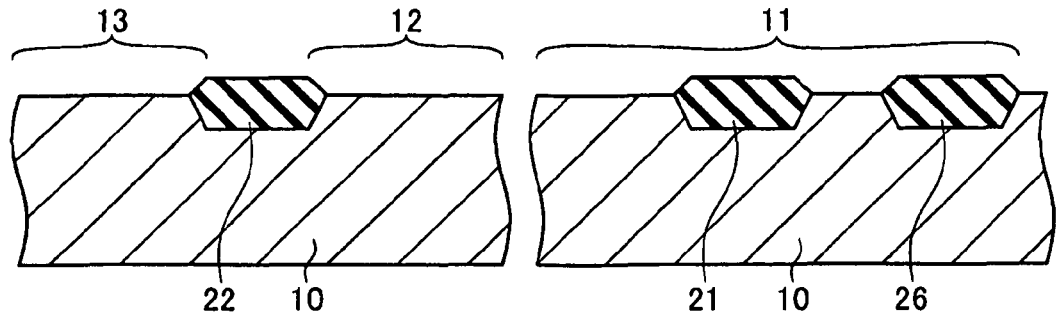
FIGS. 4A, 4B, and 4C show cross-sectional views showing steps of manufacturing the first to third transistors shown in FIGS. 2 and 3.
Figure 4:
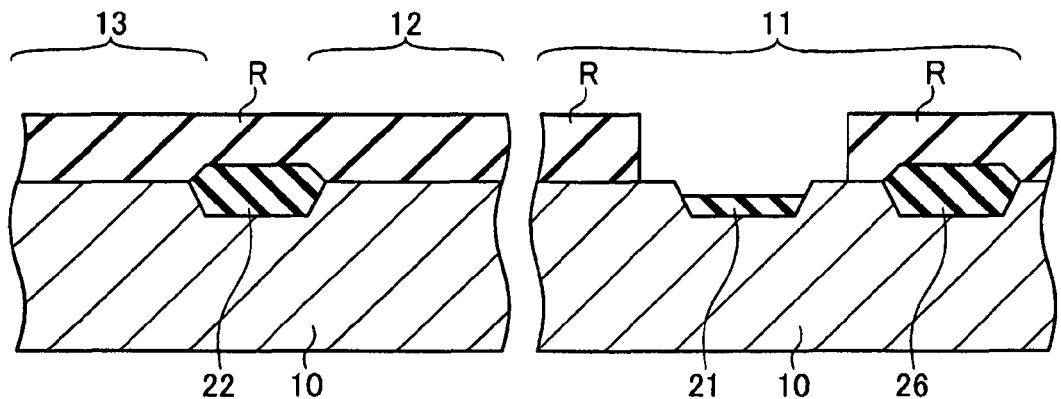
Figure 4:
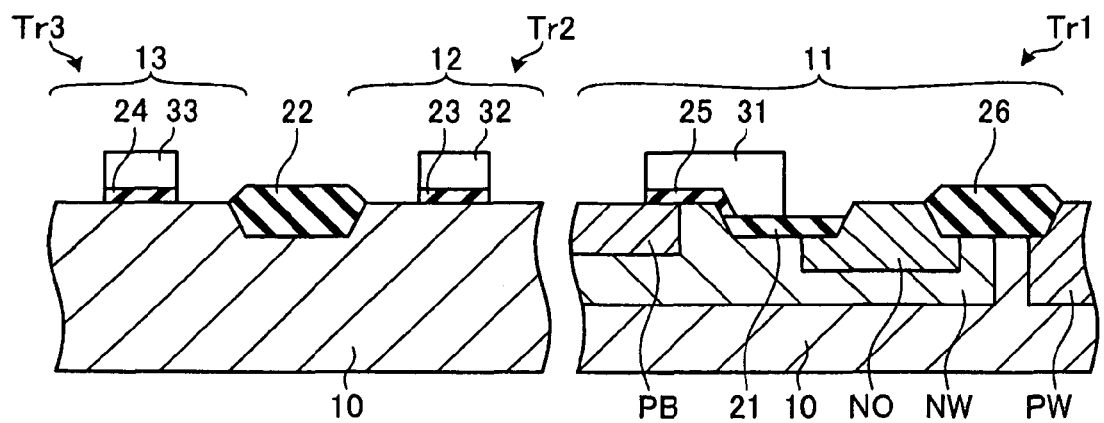

First, as shown in FIG. 4A, on the first face of the semiconductor substrate 10, the first insulation film 21 and the sixth insulation film 26 are formed on a portion of the first region 11, and the second insulation film 22 is formed between the second region 12 and the third region 13. The insulation films are formed using semi-recessed LOCOS so as to be embedded in the semiconductor substrate 10. At this point in time, the insulation films have approximately the same thickness. For example, a thickness of around 4200 angstroms is used.

Next, as shown in FIG. 4B, a resist R is patterned such that the second insulation film 22 and the sixth insulation film 26 are covered and the first insulation film 21 is exposed, and the upper end of the first insulation film 21 is etched using wet etching. The position of the opening of the resist R for causing the first insulation film 21 to be exposed is indicated by the reference numeral RO in FIG. 1. Using wet etching, the thickness of the first insulation film 21 is reduced to less than the thickness of the second insulation film 22 and the first insulation film 26. For example, the thickness of the first insulation film 21 is set to around 1500 angstroms. The etching method is not limited to wet etching. Dry etching may be used as well.

Next, as shown in FIG. 4C, impurity implantation and annealing processing are performed, and in the first region 11, the n-well NW, the p-well PW, the p-body region PB, and the n-offset region NO are formed.

Furthermore, the third insulation film 23 is formed in the second region 12, the fourth insulation film is formed in the third region 13, and the fifth insulation film 25 is formed in the first region 11. The third to fifth insulation films 23 to 25 are formed using thermal oxidation. The thickness of the third to fifth insulation films 23 to 25 are set to around 135 angstroms. The fifth insulation film 25 is formed at a position of being in contact in a plan view with the first insulation film 21.

Furthermore, the second gate electrode 32 is formed on the third insulation film 23, the third gate electrode 33 is formed on the fourth insulation film 24, and the first gate electrode 31 is formed on the fifth insulation film 25 and a portion of the first insulation film 21.

Figure 5D:
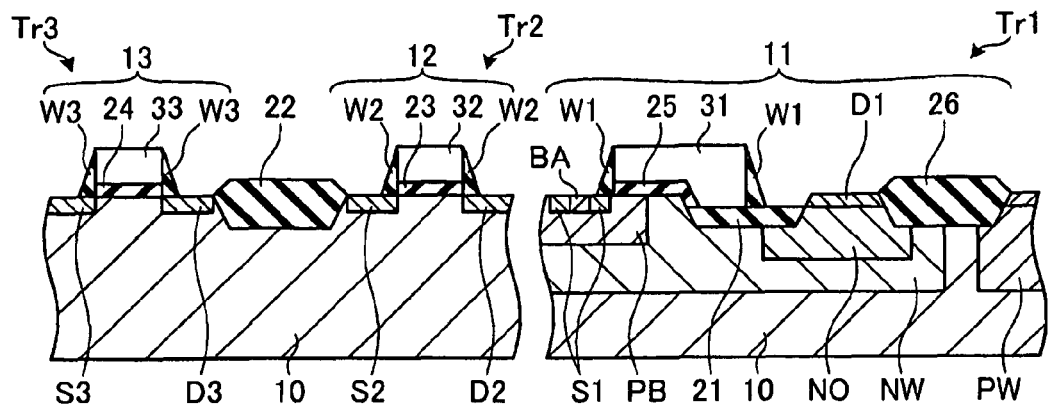
FIGS. 5D, 5E, and 5F show cross-sectional views showing steps of manufacturing the first to third transistors shown in FIGS. 2 and 3.

Next, as shown in FIG. 5D, side walls W1 to W3 are formed on the respective side faces of the first to third gate electrodes 31 to 33. Impurity implantation and annealing processing are furthermore performed, the source region S1, the drain region D1, and the body contact region BA are formed in the first region 11, and the source S2 and the drain D2 of the second region 12 and the source S3 and the drain D3 of the third region 13 are formed.

According to the above description, the first to third transistors Tr1 to Tr3 shown in FIGS. 2 and 3 are manufactured. Furthermore, a configuration not shown in FIGS. 2 and 3 is manufactured as follows, for example.

Figure 5E:
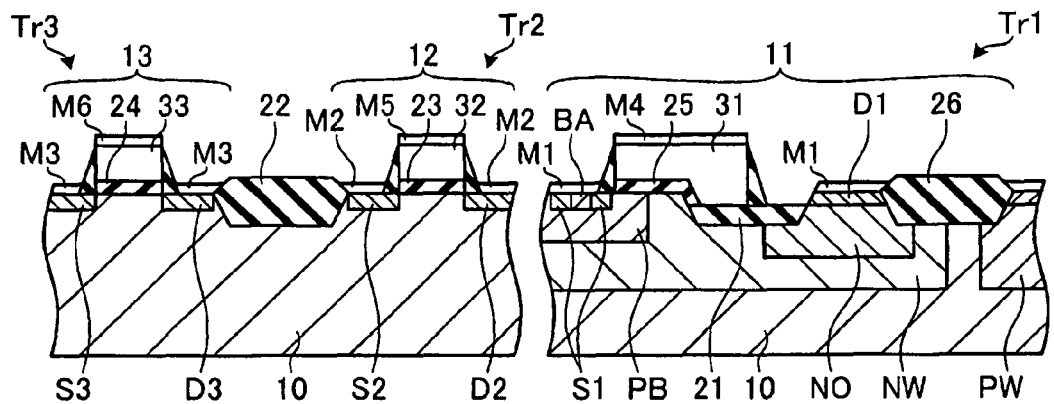

As shown in FIG. 5E, metallic silicide layers M1 to M6 are formed on the upper faces of the body contact region BA, the source regions S1 to S3, the drain regions D1 to D3, and the first to third gate electrodes 31 to 33.

Figure 5F:
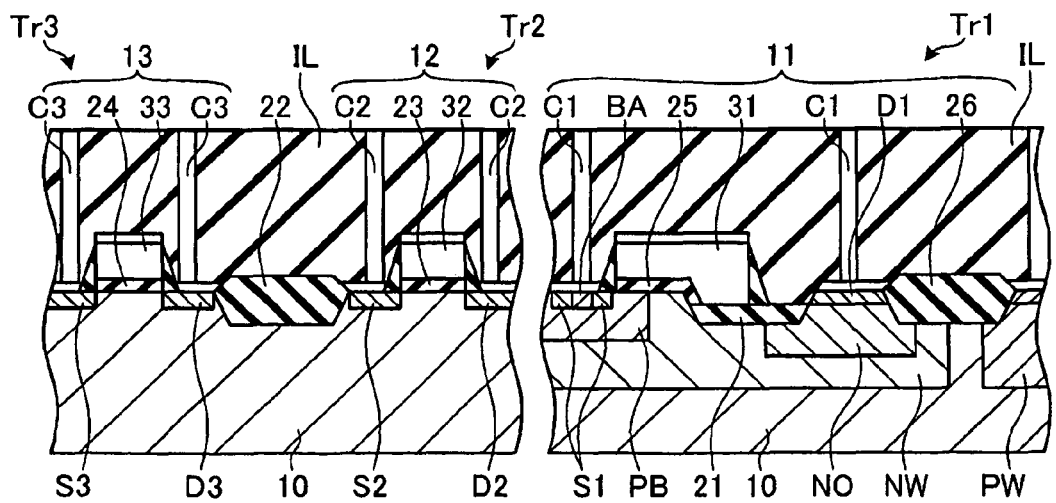

Next, as shown in FIG. 5F, an inter-layer insulation film IL is formed on the first region 11, the second region 12, and the third region 13, and contact portions C1 to C3 that are connected to the respective source regions S1 to S3 and the respective drain regions D1 to D3, and contact portions (not shown) that are connected to the respective first to third gate electrodes 31 to 33 are formed in the inter-layer insulation film IL.

It should be noted that, when it is expressed that a specific B (referred to as "B" below) is formed (positioned) on a specific A (referred to as "A" below), the meaning is not limited to the case of B being formed (B being positioned) directly on A, but also includes the case where B is formed (B is positioned) on A via a third material as far as the effect of the invention is not impaired.

The entire disclosure of Japanese Patent Application No. 2013-145222, filed Jul. 11, 2013 is expressly incorporated by reference herein.

What is claimed is:

1. A semiconductor device, comprising:
   a semiconductor substrate;
   a first transistor that is positioned on the semiconductor substrate and includes a first insulation film and a first gate electrode positioned on the first insulation film;
   a second transistor that is positioned on the semiconductor substrate;
   a third transistor that is positioned on the semiconductor substrate; and
   a second insulation film that is positioned between the second transistor and the third transistor and has a thickness that is greater than the thickness of the first insulation film,
   the second transistor including third insulation film and a second gate electrode positioned on the third insulation film,
   the third transistor including a fourth insulation film and a third gate electrode positioned on the fourth insulation film,
   the difference in height between the upper end of the first insulation film and the upper end of the second insulation film being greater than the difference in height between the lower end of the first insulation film and the lower end of the second insulation film,
   the first transistor further including a fifth insulation film that has a thickness that is less than the thickness of the first insulation film, the first gate electrode being positioned so as to span over a portion of the first insulation film and the fifth insulation film, and the upper end of the first insulation film being located at a lower position than the upper end of the fifth insulation film.

* * * * *